United States Patent [19]

Watanabe

[11] Patent Number: 5,548,741
[45] Date of Patent: Aug. 20, 1996

[54] IC MEMORY CARD SYSTEM HAVING A HOST PROCESSOR SELECTIVELY OPERABLE WITH AN IC MEMORY CARD INCLUDING EITHER AN SRAM OR AN EEPROM

[75] Inventor: Mikio Watanabe, Tokyo, Japan

[73] Assignee: Fuji Photo Film Co., Ltd., Kanagawa, Japan

[21] Appl. No.: 387,376

[22] Filed: Feb. 13, 1995

Related U.S. Application Data

[63] Continuation of Ser. No. 828,675, Jan. 31, 1992, abandoned.

[30] Foreign Application Priority Data

Feb. 7, 1991 [JP] Japan ................................ 3-036539

[51] Int. Cl.$^6$ .................................................. G06F 13/26
[52] U.S. Cl. ........................ 395/442; 395/430; 395/432
[58] Field of Search ...................... 395/400 MS, 425 MS

[56] References Cited

U.S. PATENT DOCUMENTS

| | | | |
|---|---|---|---|
| 4,811,303 | 3/1989 | Hirai | 365/189 |
| 4,931,997 | 6/1990 | Mitsuishi et al. | 365/218 |
| 5,016,212 | 5/1991 | Yamaguchi et al. | 395/425 |
| 5,016,223 | 5/1991 | Kimura et al. | 365/229 |
| 5,153,730 | 10/1992 | Nagasaki et al. | 358/209 |
| 5,208,732 | 4/1993 | Baudouin et al. | 361/386 |
| 5,252,812 | 10/1993 | Nakamura | 235/380 |
| 5,257,388 | 10/1993 | Hayamizu | 395/800 |
| 5,265,048 | 11/1993 | Kimura | 365/189.01 |
| 5,303,198 | 4/1994 | Adachi et al. | 365/218 |
| 5,386,539 | 1/1995 | Nishi | 395/425 |

FOREIGN PATENT DOCUMENTS

| | | |
|---|---|---|
| 0408002 | 1/1991 | European Pat. Off. . |
| 8900466 | 9/1988 | France . |

OTHER PUBLICATIONS

Article: "IC Memory Card Guidelines" from Japan Electronic Industry Development Association Personal Computer Operation Committee; pp. 1–2, 8–9; and 48–51.

Primary Examiner—Reba I. Elmore

[57] ABSTRACT

An IC (Integrated Circuit) memory card system is provided having a host processor and an IC memory card capable of storing picture data or similar data. When the host processor rewrites data stored in the memory card, the processor sends an erase signal together with state signals to the memory card with no regard to the type of a memory built in the latter, i.e., an SRAM (Static Random Access Memory) or an EEPROM (Electrically Erasable Programmable Read Only Memory). The memory card with an EEPROM erases data in response to the erase signal, while the memory card with an SRAM awaits data from the host processor by neglecting the erase signal. During the erasure, the memory card with an EEPROM continuously sends a busy signal to the host processor to cause the host processor to temporarily stop sending data. On completing the erasure, the memory card cancels the busy signal, receives data from the host processor, and writes data in. In the case of the memory card with an SRAM which does not send the busy signal, the host processor continuously sends data thereto without interruption.

15 Claims, 4 Drawing Sheets

| PIN NO. | LABEL | I/O | MEANING |
|---|---|---|---|
| 1 | GND | - | BIDIRECTIONAL BUS |
| 2 | D0 | I/O | BIDIRECTIONAL BUS |
| 3 | D1 | I/O | BIDIRECTIONAL BUS |
| 4 | D2 | I/O | BIDIRECTIONAL BUS |
| 5 | D3 | I/O | BIDIRECTIONAL BUS |
| 6 | D4 | I/O | BIDIRECTIONAL BUS |
| 7 | D5 | I/O | BIDIRECTIONAL BUS |
| 8 | D6 | I/O | BIDIRECTIONAL BUS |
| 9 | D7 | I/O | BIDIRECTIONAL BUS |
| 10 | Vcc | - | POWER SOURCE (5V) |
| 11 | Vpp | - | POWER SOURCE (12V) |
| 12 | RDY/BSY | O | READY/BUSY |
| 13 | CE | I | CARD ENABLE |
| 14 | A0 | I | STATE SIGNAL (ADDRESS/DATA) |
| 15 | A1 | I | STATE SIGNAL (ADDRESS/DATA) |
| 16 | RD | I | READ |
| 17 | WR | I | WRITE |
| 18 | WP | O | WRITE PROTECT |
| 19 | A2 | I | ERASE |
| 20 | GND | - | GROUND |

IC MEMORY CARD SYSTEM HAVING A HOST PROCESSOR SELECTIVELY OPERABLE WITH AN IC MEMORY CARD INCLUDING EITHER AN SRAM OR AN EEPROM

This application is a continuation of application Ser. No. 07/828,675 filed on Jan. 31, 1992, now abandoned.

BACKGROUND OF THE INVENTION

1. Field of the Invention

The present invention relates to an IC (Integrated Circuit) memory card system for recording picture data or similar data.

2. Description of the Related Art

A current trend in the digital electronic still camera or similar imaging apparatus art is toward the use of an IC memory card with a semiconductor memory as a medium for recording picture data representative of a scene picked up. While the IC memory card for such an application has customarily been implemented with an SRAM (Static Random Access Memory), an IC memory card with a built-in EEPROM (Electrically Erasable Programmable Read Only Memory) is attracting much attention from, among others, the cost standpoint. In a digital electronic still camera, therefore, the interface to the IC memory card should preferably be operable with both of an SRAM and an EEPROM.

Regarding an IC memory card system using an SRAM, assume that data are inputted to or outputted from the memory card over an 8-bit parallel transfer bus. Then, the memory card is provided with a connector having eight terminals, and not only data to be written to or read out of a memory chip but also an address designating a storage location are applied to the eight terminals. The data and the address are distinguished from each other by the logical states of a first and a second state terminal also included in the connector. When the address specifying a particular storage location of the memory chip is constituted by a plurality of bytes, the bytes are each represented by a particular combination of the logical states of the two state terminals. Assuming an IC memory card with an SRAM having a capacity greater than 64 bytes, for example, an address is constituted by three bytes, i.e., a lower byte, an intermediate byte, and a higher byte. In such a case, the first and second state terminals indicate the reading of the lower byte when both of the first and second state terminals are in a logical low level, the reading of the intermediate byte when the first state terminal is in a high level and the second state terminal is in a low level, or the reading of the higher byte when the first state terminal is in a low level and the second state terminal is in a high level. Further, the first and second state terminals indicate the reading or writing of data when both are in a high level. The write-in and read-out of data are distinguished from each other on the basis of the logical states of read terminal and a write terminal further included in the connector. For example, data is read out when the read terminal is in a high level or written in when the write terminal is in a high level. As stated above, the connector of an IC memory card using an SRAM has data terminals for inputting and outputting data and addresses, state terminals for distinguishing data and addresses, and a read and a write terminal for distinguishing the write-in and the read-out. Data is written to or read out of the memory card on the basis of control signals which are sent from the camera to such terminals.

In an EEPROM, when old data exists in an address where new data should be written in, the new data cannot be written in the address unless the old data is deleted. For the erasure of old data and the write-in of new data, a program voltage of 12 volts is needed in addition to a logical voltage of 5 volts. Further, an IC memory card with an EEPROM performs unique operations which an IC memory card with an SRAM does not perform, e.g., erasure and verification. Hence, a memory card with an EEPROM has to send a busy signal to the camera or host indicating that processing is under way in the card, so that the camera may temporarily stop sending control signals or data while such unique operations are under way.

An I/O (input/output) bus system proposed in "IC Memory Card Guideline" by Japan Electronics Industry Development Association (JEIDA) has a program voltage terminal and an indication terminal or ready/busy terminal. However, the problem with an IC memory card using an I/O bus type EEPROM is that the card has to determine whether or not to execute erasure and generate an erase signal within itself. This type of memory card, therefore, has a more complicated controller arrangement and a lower operation rate than an IC memory card with an SRAM.

SUMMARY OF THE INVENTION

It is, therefore, an object of the present invention to provide an IC memory card system in which a host processor is selectively operable with either of an IC memory card with an SRAM or an IC memory card with an EEPROM.

It is another object of the present invention to provide an IC memory card system which simplifies the construction of an IC memory card with an EEPROM and increases the operation speed of such a memory card.

An IC memory card system of the present invention comprises a host processor, a data recording medium in the form of an IC memory card having an SRAM or an EEPROM built therein and detachably mounted on the host processor, and a connector connecting the host processor and IC memory card. The connector has a plurality of data/address terminals to which a bus for transferring data and an address is connected, two state terminals to which state signals for distinguishing data and an address to be sent over the data/address bus terminals are fed, an erase signal terminal to which, when data stored in the IC memory card with an EEPROM should be rewritten, an erase signal is fed for the host processor to command the IC memory card to erase data stored in a particular address of the IC memory card, and an indication terminal for sending, while processing is under way in the IC memory card with an EEPROM, a busy signal to the host processor for causing the host processor to temporarily stop accessing the IC memory card.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

Figure 1:
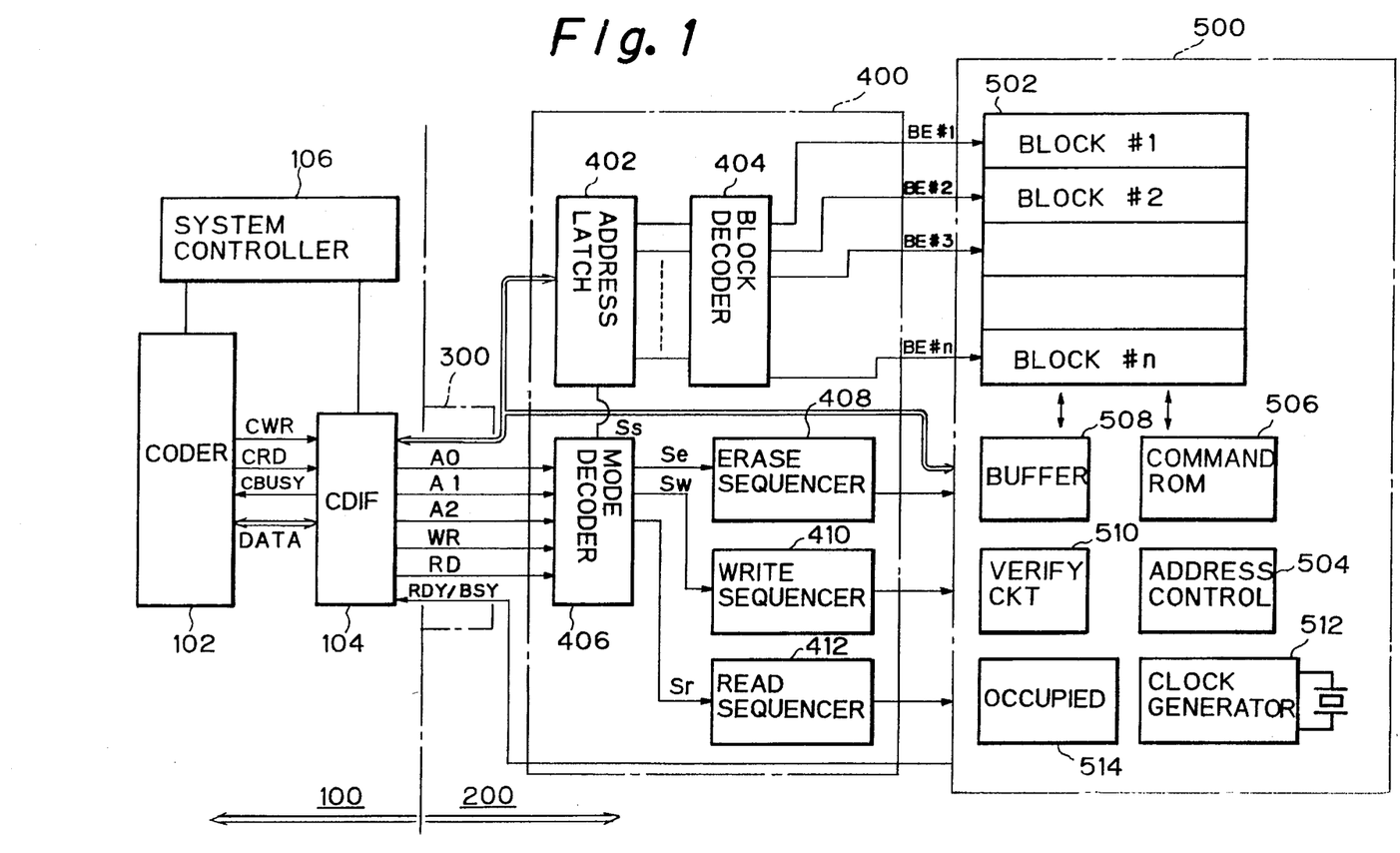
FIG. 1 is a block diagram schematically showing an embodiment of the IC memory card system in accordance with the present invention.

Referring to FIG. 1 of the drawings, an IC memory card system embodying the present invention is shown. As shown, a data recording medium in the form of an IC memory card 200 with a built-in EEPROM or an IC memory card with a built-in SRAM, not shown, is detachably connected to an electronic still camera or similar host processor 100 via a connector 300. The construction and operation of the system will be described on the assumption that the memory card 200 with a built-in EEPROM is connected to the host processor 100. FIG. 1 shows only part of the host processor 100 which is relevant to the control over the memory card 200. The other part of the host processor 100 that is not related to the understanding of the embodiment will not be described.

The host processor 100 has a coder 102 for coding data, a card interface (CDIF) 104, and a system controller 106. The coder 102 is made up of a coding circuit for converting, for example, picture data to data of format matching the recoding system of the memory card 200, and a decoding circuit for decoding data read out of the memory card 200 to picture data matching the host processor 100, although not shown in the figure. The coded data is transferred from the coder 102 to the memory card 200 over a data bus DATA which is connected to the CDIF 104. Likewise, the data read out of the memory card 200 is transferred to the coder 102 over the data bus DATA.

In the illustrative embodiment, the coder 102 additionally has a function of sending a control signal to the memory card 200 via the CDIF 104 in the event of writing or reading data in or out of the memory card 200. The control signal is a write signal CWR commanding the writing of data converted by the coding circuit in the memory card 200, or a read signal CRD commanding the reading of data out of the memory card 200. A write address or a read address is sent to the memory card 200 over the data bus DATA before the data. A central processing unit (CPU), not shown, is included in the system controller 106 and generates the addresses and control signals. The coder 102 is controlled such that, on receiving a signal BUSY from the memory card 200 via the CDIF 104, the coder 102 simply waits until the time for sending the next control signal or data. The signal BUSY indicates that processing is under way in the memory card 200. Connected to the connector 300, the CDIF 104 plays the role of an input/output interface for allowing the memory card 200 and the coder 102 to interchange signals with each other. The CDIF 104 sends, in addition to the data and control signals from the coder 102, state signals A0 and A1 which distinguish data and addresses, and an erase signal A2 for rewriting data stored in the EEPROM. These signals A0, A1 and A2 are also generated by the CPU of the system controller 106.

The system controller 106 controls the coder 102 and CDIF 104. Specifically, to write data coded by the coder 102 in the memory card 200, the system controller 106 generates a write signal CWR and a particular write address of the memory card 200 and sends them to the memory card 200 via the coder 102. At the same time, the system controller I 06 sends state signals A0 and A1 distinguishing the write address from the data, and an erase signal A2. To read data out of the memory card 200, the system controller 106 generates a read signal CRD and a particular read address of the memory card 200 and sends them to the memory card 200 via the coder 102. At the same time, the system controller 106 sends state signals A0 and A1 to the memory card 200 via the CDIF 104.

The memory card 200 has an input/output (I/O) section 400, and a memory chip 500 including an EEPROM cell 502. The I/O section 400 executes processing for inputting the control signals and addresses sent from the host processor 100 and outputting data to the host processor 100. The EEPROM cell 502 is implemented as a block erasure type, a kind of flushing type, EEPROM having a plurality of blocks #1, #2, . . ., #n. In this embodiment, the blocks #1-#n each has a capacity of eight kiliobytes and allows eight bits of data to be written in or read out at a time. In the event of erasure, all the eight kilobytes of data stored in any of the blocks are erased at the same time. An address control 504 is incorporated in the memory chip 500. The I/O section 400 accesses the leading address of a particular one of the blocks #1-#n while the address control 504 sequentially increments the address of the block, whereby data are sequentially written to or read out of the block of interest. A command ROM 506 delivers a write command or a read command to the EEPROM cell 502. Data read out of any one of the blocks #1-#n is sent to the host processor 100 via a buffer 508. Data to be written in any one of the blocks #1-#n is transferred to the block via the buffer 508.

A verifying circuit 510 is also incorporated in the memory chip 500 and, every time data is written to any one of the blocks #1-#n, verifies data by error checking or similar processing. A clock generator 512 generates a clock, or synchronizing signal, for the transfer and write-in of data. An occupied area map 514 shows the varying state of data storage in the blocks #1-#n of the EEPROM cell 502, e.g., blocks which have become usable.

The I/O section 400 accesses the memory chip 500 on receiving the control signals, i.e., state signals A0 and A1 and write signal WR or read signal RD, and an address from the host processor 100. The I/O section 400 is made up of an address latch 402, a block decoder 404 a mode decoder 406, an erase sequencer 408, a write sequencer 410, and a read sequencer 412. The address latch 402 is constituted by a plurality of address registers and latches an address constituted by a plurality of bytes sent from the host processor 100 over the data bus DATA, byte by byte. The block decoder 404 decodes the address latched by the address latch 402 and generates one of block enable signals BE#1, BE#2, . . ., BE#n for accessing one of the blocks #1-#n of the EEPROM cell 502 which is designated by the address.

Figure 3:
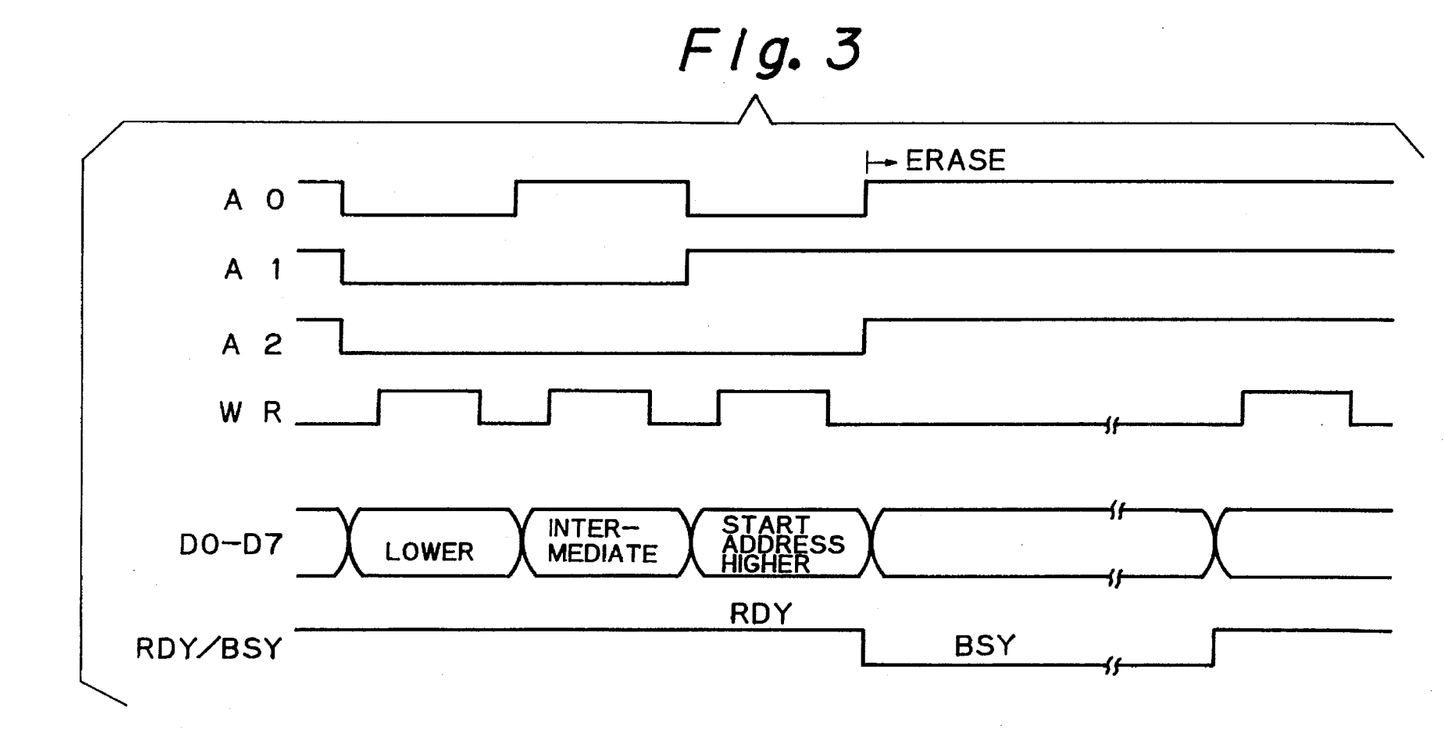
FIG. 3 is a timing diagram demonstrating a data erasing procedure particular to one embodiment.

The state signals A0 and A1, erase signal A2 and write signal WR or read signal RD from the host processor 100 are applied to the mode decoder 406 via the connector 300. In response, the mode decoder 406 outputs an erase mode signal Se, a write mode signal Sw or a read mode signal Sr and select signals Ss for activating the registers of the address latch 402. Specifically, when both of the state signals A0 and A1 are in a low level and the write signal WR is in a high level, the mode decoder 406 delivers a select signal Ss for activating a first register included in the address latch 402. As a result, the address latch 402 latches a lower address represented by eight bits. When the state signals A0 and A1 are in a high level and a low level, respectively, and the write signal WR goes high, the mode decoder 406 outputs a select signal Ss for activating a second register, thereby latching an intermediate address in the address latch 402. Further, as the state signals A0 and A1 go low and high, respectively, and the write signal WR goes high, the mode decoder 406 outputs a select signal Ss for activating a third register and thereby latches a higher address in the address latch 402. Further, when an erase signal A2 is sent from the host processor 100 together with the state signals A0 and A1, the mode decoder 406 feeds an erase mode signal Se to the erase sequencer 408 after the reception of an address. The erase signal A2 usually remains in its high level and goes low immediately prior to erasure, as shown in FIG. 3. Thereafter, as the write signal WR goes high on the delivery of data, the mode decoder 406 delivers a write mode signal Sw to the write sequencer 410. When the read signal RD goes high after the arrival of an address, the mode decoder 406 delivers a read mode signal Sr to the read sequencer 412.

In response to the erase mode signal Se, the erase sequencer 408 accesses the command ROM 506 of the memory chip 500 to cause the command ROM 506 to feed an erase command to the EEPROM cell 502. As a result, data stored in one of the blocks #1-#n being designated by the block decoder 404 is erased.

The write sequencer 410 is responsive to the write mode signal Sw for controlling the sequence in which the memory chip 500 writes data therein. Specifically, on receiving the write mode signal Sw, the write sequencer 410 activates the buffer 508 and clock generator 512 to write data sent from the host processor 100 in the buffer 508. Subsequently, the write sequencer 410 accesses the command ROM 506 to cause the command ROM 506 to feed a write command to the EEPROM cell 502, while starting the clock generator 512 and buffer 508. Consequently, the data stored in the buffer 508 is written to the block of the EEPROM cell 502 which is designated by the block decoder 404. Then, the write sequencer 410 activates the verifying circuit 510 to compare the data written to the above-mentioned block of EEPROM cell 502 with the data stored in the buffer 508. On completing the comparison, the write sequencer 410 activates the address control 504 to increment the address of the block. The write sequencer 410 repeats the above procedure to sequentially write data being fed from the host processor 100, eight bits at a time.

In response to the read mode signal Sr from the mode decoder 406, the read sequencer 412 controls the sequence for reading data out of the memory chip 500. Specifically, on receiving the read mode signal Sr, the read sequencer 412 causes the command ROM 506 to feed a read command to the EEPROM cell 502. At the same time, the read sequencer 412 activates the buffer 508 and clock generator 512 to read data out of the block of the EEPROM cell 502 which is designated by the block decoder 404. The read sequencer 412, like the write sequencer 410, repeats such a procedure on an 8-bit bit basis.

Figure 2:
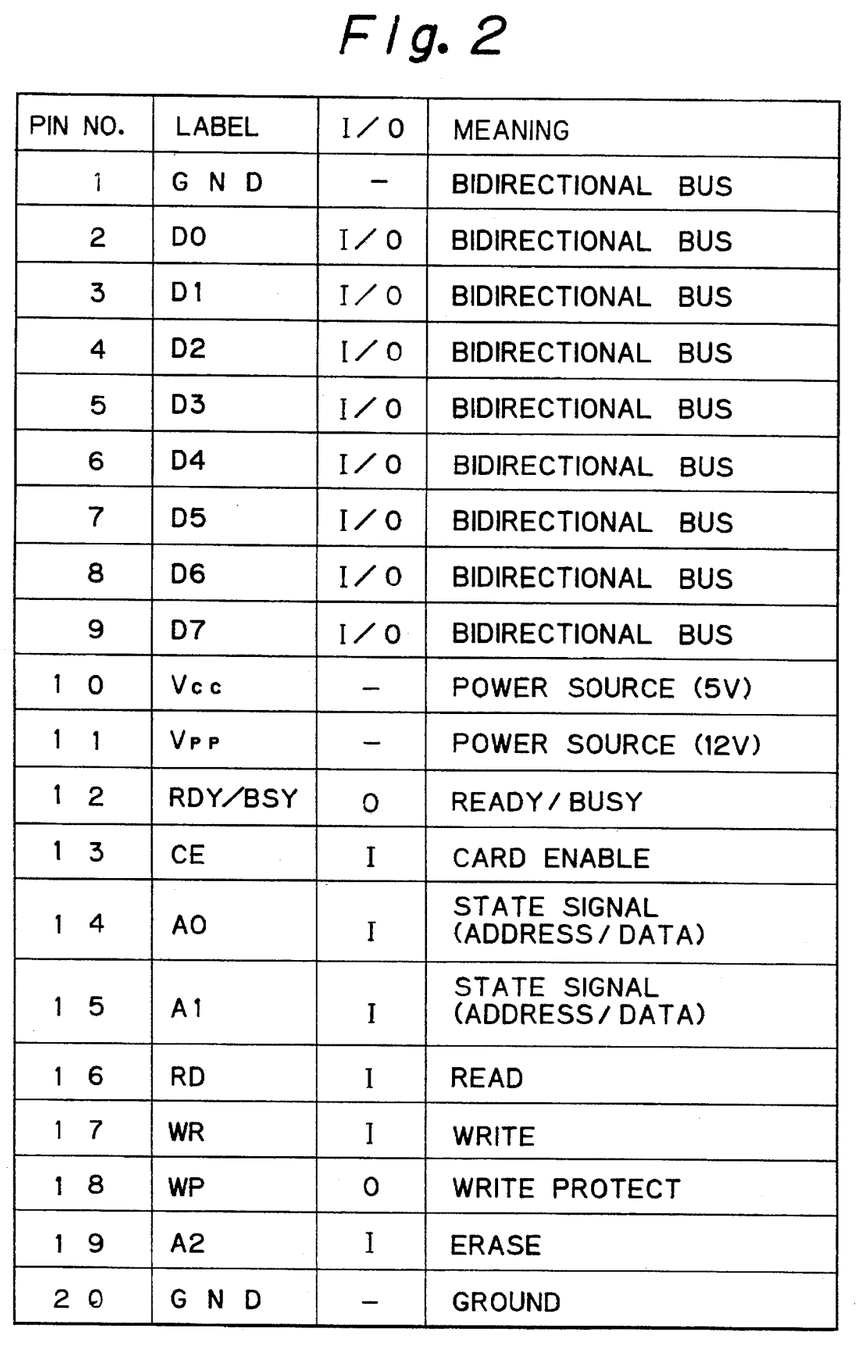
FIG. 2 is a table representative of a specific terminal arrangement of a connector included in an embodiment.

As shown in FIG. 2, the connector 300 connecting the memory card 200 and host processor 100 has twenty pins or terminals. Terminals 1 and 20 are ground terminals. Terminals 2–9 are data terminals to which data and address are selectively applied. A terminal 10 is a logical power source terminal via which a voltage of 5 volts for reading data is applied from the host processor 100 to the memory card 200. A terminal 11 is a program power source terminal to which a voltage of 12 volts is applied for writing or erasing data. A terminal 12 is an indication terminal via which the signal BUSY indicative of the busy state of the memory card 200 may be sent from the memory card 200 to the host processor 100. A terminal 13 is a card enable terminal for rendering the memory card 200 active. Terminals 14 and 15 are state terminals to which the state signals A0 and A1, respectively, are fed. Terminals 16 and 17 are respectively a read terminal to which the read signal RD is applied and a write terminal to which the write signal WR is applied. A terminal 18 is a protect terminal for sending a write inhibit signal to the host processor 100 when a write protect switch, not shown, provided on the memory card 200 is turned on. Further, a terminal 19 is an erase terminal to which the erase signal A2 is applied. These terminals are also applicable to an IC memory card having a built-in SRAM. The difference is that an IC memory card with an SRAM operates without the terminals 11, 12 and 19 connected to the inside thereof, i.e., by neglecting the write/erase voltage, signal BUSY, and erase signal A2.

Figure 4:
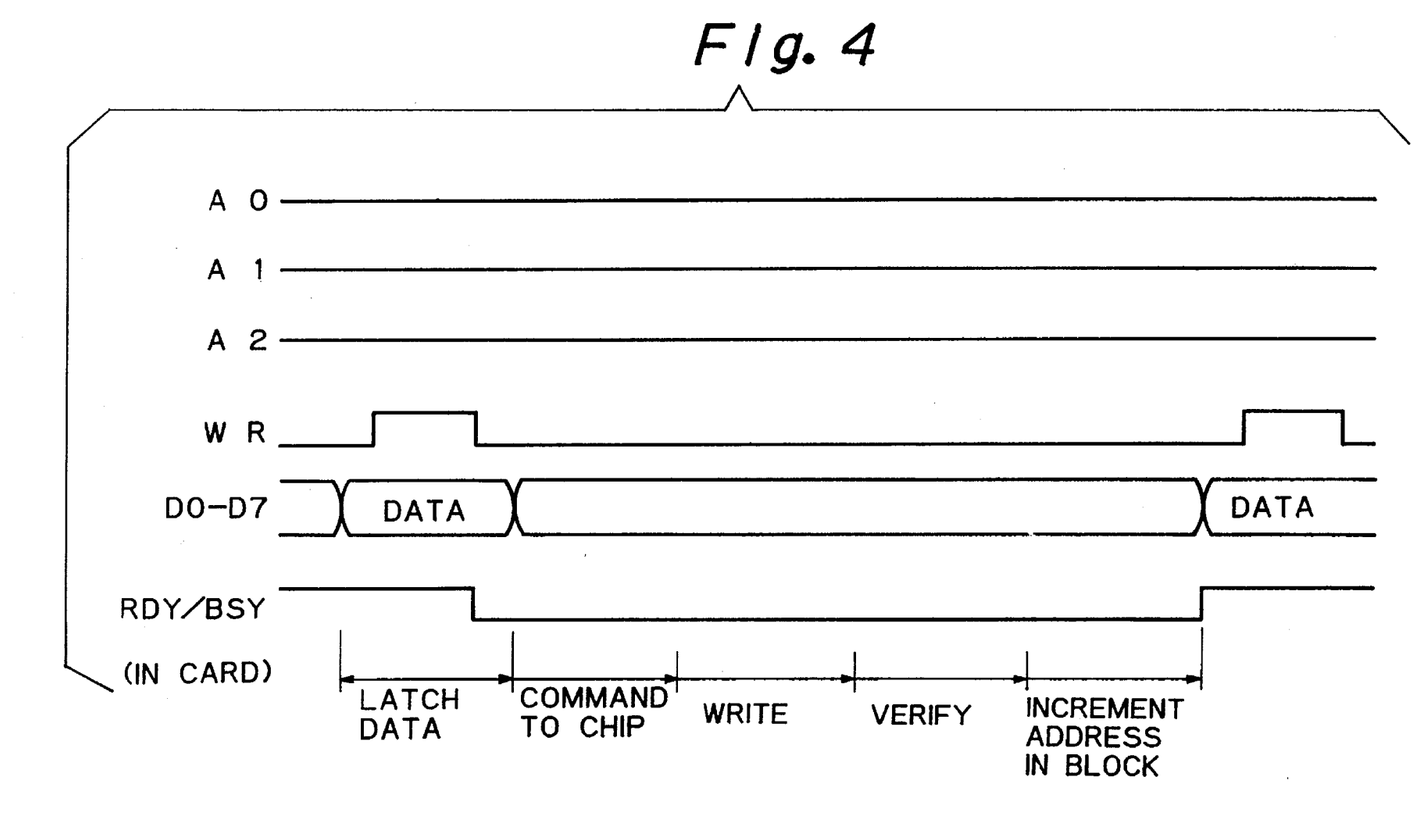
FIG. 4 is a timing diagram of a data writing procedure particular to one embodiment.

Specific operations of the IC memory card system having the above construction will be described with reference to FIGS. 1, 3 and 4. The operator of the system connects the connector 300 of the IC memory card 200 to the electronic still camera or similar host processor 100 and then operates the host processor 100 in a predetermined manner.

To write data in the memory card 200, the host processor 100 sends an address signal to the memory card 200 via the data terminals D0-D7 three consecutive times, i.e., a lower address, an intermediate address and a higher address each having one byte, as shown in FIG. 3. At this instant, the state signal A0 is in a low level for the lower address, in a high level for the intermediate address, and in a low level for the higher address. The state signal A1 is in a low level for the lower and intermediate addresses and in a high level for the higher address. The erase signal A2 remains in a low level until all the three consecutive addresses have been sent to the memory card 200. The write signal WR goes high every time such an address is sent to the memory card 200.

On receiving the above-stated control signals and addresses, the memory card 200 causes the mode decoder 406 to send a select signal Ss to each of the registers constituting the address latch 402. As a result, the registers of the address latch 402 are activated to store one of the lower, intermediate and higher addresses each. The block decoder 404 decodes the complete address so latched in the address latch 402 and then accesses a particular block of the EEPROM cell 502 designated by the address by feeding a block enable signal BE to the block of interest. Subsequently, the mode decoder 406 delivers an erase mode signal Se to the erase sequencer 408. In response, the erase sequencer 408 accesses the command ROM 506 to send an erase command to the EEPROM cell 502, whereby the content of the block being accessed by the block decoder 404 is erased. While the operation described so far is under way, the memory chip 500 maintains the indication or ready/busy terminal 12 in a low level to send a signal BUSY to the host processor 100, indicating that the memory card 200 is executing processing. The host processor 100 does not send any data to the memory card 200 so long as the host processor 100 receives the signal BUSY.

After the content of the block of interest has been erased by the above procedure, the memory chip 500 causes the indication terminal 12 to go high to thereby cancel the signal BUSY. Then, the host processor 100 sends the first eight bits of data to the memory card 200. At this instant, the write signal WR goes high. In response to the write signal WR, the mode decoder 406 delivers a write mode signal Sw to the write sequencer 410. In response, the write sequencer 410 activates the buffer 508 and clock generator 512 with the result that the eight bits of data fed from the host processor 100 are latched in the buffer 508. Then, the write sequencer 410 accesses the command ROM 506 to feed a write command to the EEPROM cell 502, while activating the buffer 508 and clock generator 512. Consequently, the data latched in the buffer 508 are sequentially written to the address being accessed by the block decoder 404. During this period of time, the memory chip 500 maintains the indication terminal 12 in a low level, i.e., sends the signal BUSY to the host processor 100 to inhibit the latter from sending the next data.

The write sequencer 410 activates the verifying circuit 510 to compare the data written to the block of interest and the data latched in the buffer 508. If the two sets of data are not equal, the write sequencer 410 again writes the data stored in the buffer 508 in the block. If the two sets of data are identical, i.e., if the data latched in the buffer 508 have been correctly written to the block of interest, the write sequencer 410 activates the address control 504 to increment the address. While such processing is under way, the indication terminal 12 is held in a low level to send the signal BUSY to the host processor 100. As the address is incremented, the memory chip 500 causes the indication terminal 12 to go high to thereby cancel the signal BUSY. Then, the host processor 100 sends the next eight bits of data to the memory card 200. At this instant, the write signal WR goes high. In response to the write signal WR, the mode decoder 406 again delivers the write signal Sw to the write sequencer 410 to cause the write sequencer to write the eight bits of data in the same block as the previous eight bits of data. In this manner, data sequentially sent from the host processor 100 are written to the successive addresses of the designated block.

To read data out of the memory card 200, the host processor 100 sends an address to the memory card 200 in the same manner that the host processor 100 writes data in the memory card 200. In the write mode operation, the host processor 100 maintains the erase signal A2 in a high level, i.e., does not send the erase signal A2 to the memory card 200 since the data stored in the blocks are not to be erased. The memory card 200, therefore, does not perform the erasing operation or send the signal BUSY. As the host processor 100 sends a read signal RD to the memory card 200 after the address, the mode decoder 406 delivers a read mode signal Sr to the read sequencer 412. In response, the read sequencer 412 accesses the command ROM 506 and activates the buffer 508 and clock generator 512. Then, the command ROM 506 feeds a read command to the EEPROM cell 502 with the result that the first eight bits of data are read out of the block being designated by the block decoder 404. These data are latched in the buffer 508 and then sent to the host processor 100 via the data terminals DO–D7. Subsequently, the read sequencer 412 activates the address control 504 to increment the address, whereby the next eight bits of data are read out of the block of interest. Such a procedure is repeated until all the desired data have been sent from the memory card 200 to the host processor 100.

While the IC memory card 200 has been assumed to be of the type incorporating an EEPROM, it may be replaced with an IC memory card having a built-in SRAM. Although the host processor 100 operates in the above-described manner even with an IC memory card having an SRAM, the host processor 100 neglects the erase signal A2 since the erase terminal 19 is not connected to the inside of such a memory card. In the write mode operation, as the host processor 100 sends data to the memory card 200 with an SRAM after an address, the memory card 200 writes the data over the data existing in the block which is designated by the address.

In summary, it will be seen that the present invention provides an IC memory card system in which a host processor is selectively operable with either an IC memory card with an EEPROM or an IC memory card with an SRAM. This stems from the fact that the host processor sends an erase signal to the memory card together with state signals distinguishing an address and data, whether the memory card is of the EEPROM type or of the SRAM type. The EEPROM type memory card erases data in response to the erase signal while sending a signal BUSY to the host processor. The SRAM type memory card is capable of writing data therein by a conventional procedure while neglecting the erase signal. The host processor has only to determine whether or not to send data to the memory card so as to be connected to an SRAM or an EEPROM included therein.

Moreover, the memory card with an EEPROM does not have to determine whether or not to erase data, i.e., the memory card performs erasure in response to the erase signal from the host processor. Such a memory card, therefore, does not have to determine whether or not to erase data or to generate an erase signal. This simplifies the control to be executed by the memory card and, therefore, the control circuitry renders rapid processing.

While the present invention has been described with reference to the particular illustrative embodiments, it is not to be restricted by these embodiments but only by the appended claims. It is to be appreciated that those skilled in the art can change or modify the embodiments without departing from the scope and spirit of the present invention.

What is claimed is:

1. A processor system alternatively cooperating with first and second types of IC memory card having an SRAM and an EEPROM, respectively, built in the first and second types of IC memory card, comprising:

a host processor having a bus for writing data in a storage location of either the first type or the second type of IC memory card designated by an address, said host processor generating the data and the address alternatively on the bus and a state signal for distinguishing the data from the address; and a connector for detachably connecting said host processor to either the first type or the second type of IC memory card, said host processor generating, when the second type of IC memory card is connected, an erase signal for erasing data stored in the storage location of the second type of IC memory card, said connector including, a plurality of data/address terminals to which the bus is connected for transferring the data and the address to either the first type or the second type of IC memory card connected to said connector, a state terminal connected to said host processor for transferring the state signal to either the first type or the second type of IC memory card connected to said connector, and an erase signal terminal connected to said host processor for transferring the erase signal to the second type of IC memory card, said erase signal terminal being disposed in said connector in a terminal position in which any signal appearing on said erase signal terminal is neglected by the first type of IC memory card when the first type of IC memory card is connected to said connector, said host processor producing the erase signal prior to rewriting data stored in a particular storage location of the second type of IC memory card, when the second type of IC memory card is connected to said connector, to command the second type of IC memory card to erase the data stored at least in the particular storage location of the second type of IC memory card corresponding to the address transferred from said data/address terminals.

2. A processor system in accordance with claim 1, wherein said connector further includes an indication terminal connected to said host processor for sending a busy signal to said host processor when the second type of IC memory card is connected to said connector, said host processor responding to the busy signal to stop accessing the second type of IC memory card.

3. A processor system in accordance with claim 1, wherein the second type of IC memory card erases, when connected to said connector and sending the busy signal to said host processor, data stored in a storage location designated by the address transferred from said plurality of data/address terminals in response to the erase signal, when rewriting the data stored in the storage location designated by the address, whereas when the first type of IC memory card is connected to said connector, the first type of IC memory card directly writes data sent from said host processor without erasing the data stored in the storage location designated by the address transferred from said plurality of data/address terminals.

4. A processor system in accordance with claim 1, wherein said host processor comprises a controller for sending to the second type of IC memory card connected to said connector, the state signal indicative of the address being transferred from said plurality of data address terminals, and the erase signal for erasing data stored in a storage location designated by the address of the second type of IC memory card when rewriting data in the storage location designated by the address.

5. An IC memory card comprising:

an EEPROM built in said IC memory card and having a storage location in which data is written when the storage location is designated by an address;

a connector for detachably connecting said IC memory card to a host processor which alternatively generates on a bus data to be stored in said IC memory card and an address designating a storage location in which the data is to be written, said host processor generating a state signal for distinguishing the data from the address and an erase signal for erasing data stored in a storage location of said IC memory card, said connector including, a plurality of data/address terminals connected to the bus for receiving the data and the address, when said IC memory card is connected to the host processor, a state terminal connectable to the host processor for receiving the state signal, when said IC memory card is connected to the host processor, and an erase signal terminal connectable to the host processor for receiving the erase signal, said erase signal terminal being disposed in said connector in a terminal position corresponding to a connector terminal for which another IC memory card having an SRAM is provided to neglect any erase signal delivered thereto from the host processor, when the IC memory card having the SRAM is connected to the host processor, the erase signal being produced by the host processor, prior to rewriting data stored in a particular storage location of said IC memory card, when the IC memory card is connected to the host processor; and a control circuit for commanding said EEPROM to erase the data stored at least in the particular storage location of said IC memory card corresponding to the address received by said data/address terminals.

6. An IC memory card in accordance with claim 5, wherein said connectable further includes an indication terminal connected to the host processor for transferring a busy signal to the host processor, when said IC memory card is connected to the host processor for processing, said busy signal causing the host processor to stop accessing said IC memory card.

7. An IC memory card in accordance with claim 5, further comprising a controller for erasing, when said IC memory card is connected to the host processor, data stored in a storage location designated by the address received by said plurality of data/address terminals, in response to the erase signal received by said erase signal terminal when rewriting the data stored in the storage location designated by the address, while a busy signal is sent to said host processor.

8. An IC memory card in accordance with claim 5, further comprising:

a mode decoder for generating an erase mode signal, a write mode signal or a read mode signal in response to a control signal sent from the host processor when said IC memory card is connected to the host processor;

an erase sequencer for erasing data stored in a storage location designated by the address received by said plurality of data/address terminals, in response to the erase mode signal received from said mode decoder;

a write sequencer for writing data in a storage location designated by the address received by said plurality of data/address terminals, in response the write mode signal received from said mode decoder; and a read sequencer for reading out data from a storage location designated by the address received by said plurality of data/address terminals, in response to the read mode signal received from said mode decoder.

9. An IC memory card system comprising:

a data recording medium in a form of either one of first and second types of IC memory card having an SRAM and an EEPROM, respectively, built in the first and second types of IC memory card;

a host processor having a bus for writing data in a storage location of either the first or the second type of IC memory card designated by an address, said host processor generating the data and the address alternatively on the bus and a state signal for distinguishing the data from the address; and a connector for detachably connecting said host processor to either the first or the second type of IC memory card, said host processor generating, when the second type of IC memory card is connected, an erase signal for erasing data stored in the storage location of the second type of IC memory card, said connector including, a plurality of data/address terminals to which a bus is connected for transferring the data and the address to either the first or the second type of IC memory card connected to said connector, a state terminal connected to said host processor for transferring the state signal to either the first or the second type of IC memory card connected to said connector, and an erase signal terminal connected to said host processor for transferring the erase signal to the second type of IC memory card, said erase signal terminal being disposed in said connector in a terminal position in which any signal appearing on said erase signal terminal is neglected by the first type of IC memory card while the first type of IC memory card is connected to said connector, said host processor producing the erase signal, prior to rewriting data stored in a particular storage location of the second type of IC memory card when the second type of IC memory card is connected to said connector, to command the second type of IC memory card to erase data stored at least in the particular storage location of the second type of IC memory card corresponding to the address transferred by said data/address terminals.

10. An IC memory card system in accordance with claim 9, wherein said connector further includes an indication terminal connected to said host processor for sending a busy signal to said host processor when the second type of IC memory card is connected to said connector, said host processor responding to the busy signal to stop accessing the second type of IC memory card.

11. An IC memory card system comprising:

a data recording medium in a form of either one of first and second types of IC memory card having an SRAM and an EEPROM, respectively, built in the first and second types of IC memory card;

a host processor having a bus for writing data in a storage location of either the first or the second type of IC memory card designated by an address, said host processor generating the data and the address alternatively on the bus in a bit parallel fashion, and two state signals for distinguishing in combination the data from the address; and a connector for detachably connecting said host processor to either the first or the second type of IC memory card, said host processor generating, when the second type of IC memory card is connected, an erase signal for erasing data stored in a storage location of the second type of IC memory card, said connector including, a plurality of data/address terminals to which the bus is connected in a bit parallel fashion for transferring the data and the address to either the first or the second type of IC memory card connected to said connector, two state terminals connected to said host processor for respectively transferring the two state signals to either the first or the second type of IC memory card connected to said connector, and an erase signal terminal connected to said host processor for transferring the erase signal to the second type of IC memory card, said erase signal terminal being disposed in said connector in a terminal position in which any signal appearing on said erase signal terminal is neglected by the first type of IC memory card while the first type of IC memory card is connected to said connector, said host processor producing the erase signal, prior to rewriting data stored in a particular storage location of the second type of IC memory card when the second type of IC memory card is connected to said connector, to command the second type of IC memory card to erase data stored at least in the particular storage location of the second type of IC memory card corresponding to the address transferred by said data/address terminals.

12. An IC memory card system in accordance with claim 11, wherein said connector further includes an indication terminal connected to said host processor for sending a busy signal to said host processor when the second type of IC memory card is connected to said connector, said host processor responding to the busy signal to stop accessing the second type of IC memory card.

13. A method of writing data in an IC memory card, comprising the steps of:

(a) preparing a data recording medium in a form of either one of first and second types of IC memory card respectively having an SRAM and an EEPROM built therein;

(b) preparing a connector for detachably connecting a host processor to either the first or the second type of IC memory card;

the connector including, a plurality of data/address terminals connectable to a bus on which data and an address are alternatively transferred from the host processor, a state terminal on which a state signal is transferred from the host processor, the state signal distinguishing the data from the address appearing on the plurality of data/address terminals, and an erase signal terminal on which an erase signal is transferred from the host processor, said erase signal terminal being disposed in the connector in a terminal position in which any signal appearing on the erase signal terminal is neglected by the first type of IC memory card while the first type of IC memory card is connected to the connector, (c) detachably connecting the data recording medium to the host processor by the connector;

(d) producing by the host processor an address designating at least a particular storage location at which data is to be rewritten to the second type of IC memory card connected to the connector, and transferring the address over the plurality of data/address terminals;

(e) producing by the host processor the state signal indicative of the address being transferred over the plurality of data/address terminals;

(f) producing the erase signal by the host processor when the second type of IC memory card is connected to the connector;

(g) erasing the data stored in the particular storage location of the second type of IC memory card corresponding to the address transferred in said step (d);

(h) producing by the host processor, following said step (g), an address designating the particular storage location of the second type of IC memory card, when connected to the connector, and transferring the produced address over the plurality of data/address terminals;

(i) producing by the host processor, following step (g), the state signal indicative of the address being transferred over the plurality of data/address terminals;

(j) producing by the host processor, following said step (g), data to be stored in the particular storage location of the second type of IC memory card connected to the connector, and transferring the produced dana over the plurality of data/address terminals;

(k) producing by the host processor the state signal indicative of the data being transferred over the plurality of data/address terminals; and (l) writing the data transferred from the plurality of data/address terminals into the particular storage location of the second type of IC memory card designated by the address transferred in said step (h).

14. A method in accordance with claim 13, wherein the connector further includes an indication terminal on which a busy signal is transferred to for the host processor, said method further comprising the steps of:
(m) generating the busy signal on the indication terminal from the second type of IC memory card when the second type of IC memory card is connected to the connector and processing; and
(n) controlling, in response to the busy signal, the host processor to stop accessing the second type of IC memory card connected to the connector.

15. A method in accordance with claim 13, further comprising the steps of:

(o) generating an erase mode signal, a write mode signal or a read mode signal in response to a control signal sent from the host processor when the data recording medium is connected to the host processor;

(p) performing said step (g) in response to the erase mode signal generated in said step (o);

(q) performing said step (l) in response to the write mode signal generated in said step (o); and (r) reading out data from a storage location designated by the address received by the plurality of data/address terminals, in response to the read mode signal generated in said step (o).

\* \* \* \* \*